(12) United States Patent
Nakao et al.

(10) Patent No.: US 6,489,909 B2
(45) Date of Patent: Dec. 3, 2002

(54) METHOD AND APPARATUS FOR IMPROVING S/N RATIO IN DIGITAL-TO-ANALOG CONVERSION OF PULSE DENSITY MODULATED (PDM) SIGNAL

(75) Inventors: Shigetoshi Nakao, Tokyo; Toshihiko Hamasaki, Yokohama, both of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/880,415

(22) Filed: Jun. 13, 2001

(65) Prior Publication Data

US 2002/0018013 A1 Feb. 14, 2002

(30) Foreign Application Priority Data

Jun. 14, 2000 (JP) ........................................ 2000-178389

(51) Int. Cl.[7] .............................................. H03M 1/66
(52) U.S. Cl. ....................... 341/144; 341/118; 341/139; 341/143; 375/242; 375/247; 375/254; 375/285; 375/296; 375/355
(58) Field of Search ................................ 341/118, 139, 341/143, 144; 375/242, 247, 254, 285, 296, 355

(56) References Cited

U.S. PATENT DOCUMENTS

| | | | | |
|---|---|---|---|---|
| 3,701,143 A | * | 10/1972 | Nacht | 340/347 |
| 4,573,188 A | * | 2/1986 | Lewinter | 381/46 |
| 4,812,815 A | * | 3/1989 | Miyakoshi et al. | 455/612 |
| 4,851,841 A | | 7/1989 | Sooch | 341/143 |
| 4,973,977 A | * | 11/1990 | Hawkins et al. | 341/144 |
| 5,019,819 A | * | 5/1991 | Kimura | 341/143 |
| 5,021,788 A | * | 6/1991 | Ueki et al. | 341/152 |
| 5,568,142 A | * | 10/1996 | Velazquez et al. | 341/126 |
| 5,854,599 A | * | 12/1998 | Heo et al. | 341/143 |
| 5,977,896 A | * | 11/1999 | Kohdaka et al. | 341/143 |
| 6,201,490 B1 | * | 3/2001 | Kawano et al. | 341/139 |
| 6,255,975 B1 | * | 6/2001 | Swanson | 341/143 |
| 6,268,818 B1 | * | 7/2001 | Xin et al. | 341/152 |
| 6,300,891 B1 | * | 10/2001 | Tani et al. | 341/144 |
| 6,304,200 B1 | * | 10/2001 | Masuda | 341/144 |
| 6,340,940 B1 | * | 1/2002 | Melanson | 341/143 |

OTHER PUBLICATIONS

"Direct Stream Digital Audio System" by Nishio et al., Audio Engineering Society Preprint 4163 (D–6), 7 pages.

* cited by examiner

*Primary Examiner*—Michael Tokar
*Assistant Examiner*—Khai M. Nguyen
(74) *Attorney, Agent, or Firm*—W. Daniel Swayze, Jr.; W. James Brady; Frederick J. Telecky, Jr.

(57) ABSTRACT

A method and apparatus for improving an S/N ratio in a digital-to-analog conversion of a PDM signal are provided. A digital-to-analog conversion system comprises an S/N ratio improving section. The S/N ratio improving section has a signal component extractor which extracts a signal component included in the PDM signal, and outputs a digitally filtered output signal. The digitally filtered output signal has a second full scale smaller than a first full scale of the PDM signal. The S/N ratio improving section also comprises a full-scale matching unit which matches the second full scale of the digitally filtered output signal with a third full scale of digital-to-analog conversion.

23 Claims, 6 Drawing Sheets

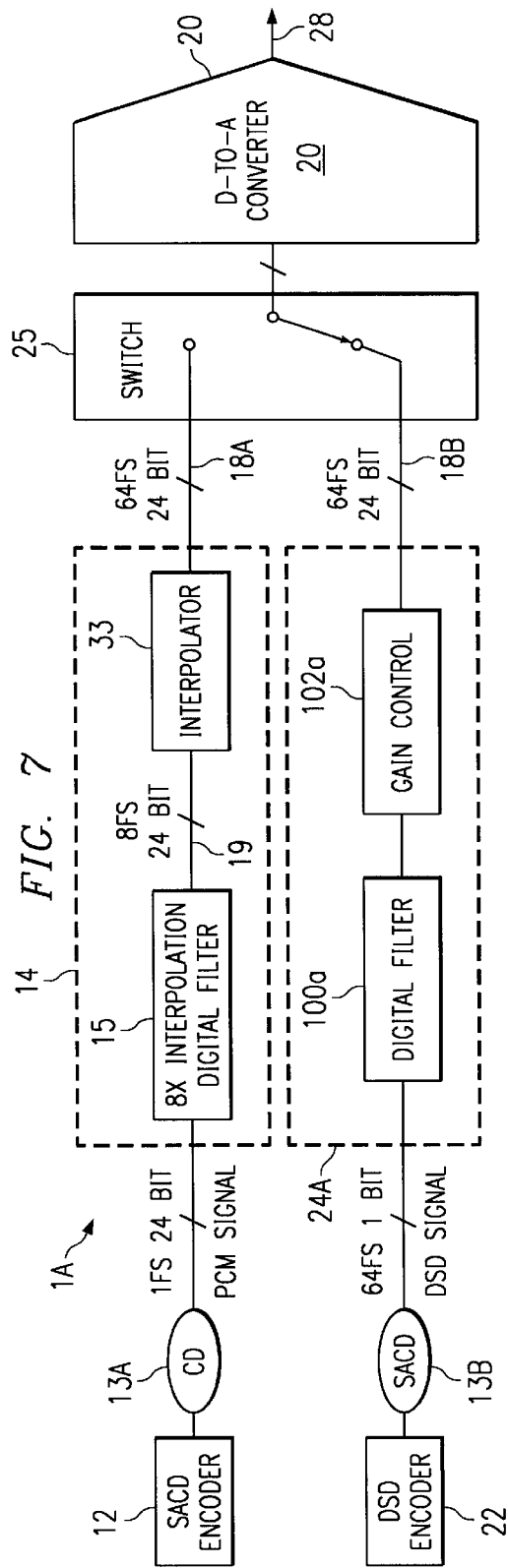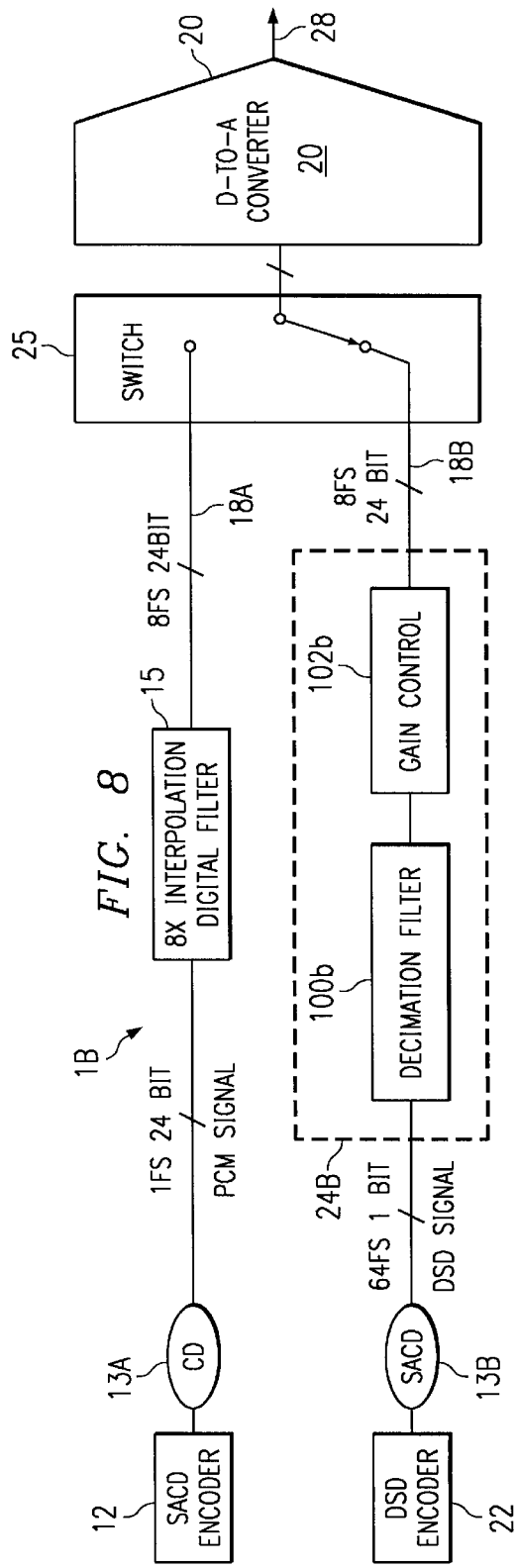

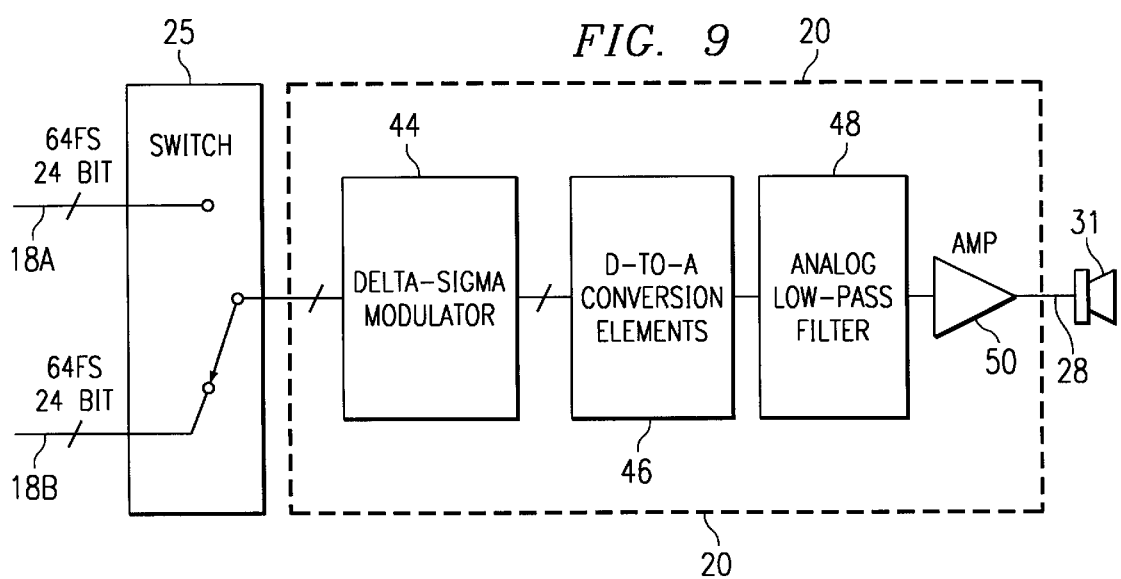

METHOD AND APPARATUS FOR IMPROVING S/N RATIO IN DIGITAL-TO-ANALOG CONVERSION OF PULSE DENSITY MODULATED (PDM) SIGNAL

BACKGROUND OF THE INVENTION

The present invention relates to a method and apparatus for improving a signal-to-noise (S/N) ratio in digital-to-analog conversion of a pulse density modulated signal (PDM signal). The invention also relates to a circuit for decoding digital information in either DSD format or SACD format and providing an analog output signal having a low signal-to-noise ratio.

A variety of methods have been proposed for converting an analog signal to a digital signal and saving the digital signal on a recording medium. Also, a variety of methods have been proposed for converting a saved digital signal to an analog signal. Instead of the PCM (pulse coded modulation) scheme which is a conventional technique of digitizing an audio signal and which is used in known CD schemes, a DSD (direct stream digital) scheme has been recently proposed for analog-to-digital conversion, which is used in known SACD (super-audio CD) schemes, digital recording and digital-to-analog conversion. The main difference between the PCM technique and the DSD technique is the decimation of the delta signal modulator output in the PCM technique before recording on the CD. In the DSD technique, the audio signal is stored in the form produced by a delta-sigma ADC (analog-to-digital converter). The DSD signal is oversampled by 64Fs (Fs is the sampling frequency 44.1 kHz). On the other hand, the signal frequency of a PCM signal produced by the PCM technique and stored in a conventional CD is just Fs. Therefore, in the PCM technique, the analog-to-digital conversion of the stored PCM signal can be accomplished by various techniques, but if it is accomplished by means of a delta-sigma ADC, then decimation filtering to decimate the 64 Fs to 1 Fs is necessary.

In the DSD scheme, an analog signal is oversampled in an encoder at 2.8224 MHZ, which is 64 times higher than the sampling frequency of 44.1 kHz, by a delta-sigma type A/D converter to be converted to a 1-bit modulated digital signal. Immediately after the conversion, the 1-bit modulated digital signal is saved on a digital signal recording medium. For reproducing an analog signal from the 1-bit modulated digital signal, a sequence of the 1-bit digital signals is averaged by an analog low pass filter or the like as it is converted to an analog signal.

Generally, a signal digitized by a delta-sigma type analog-to-digital converter results in a pulse density modulated signal (PDM signal). A full-scale amplitude of a source analog signal is reduced to approximately 50% in the digitized signal. The concept of the SACD technique is using a 1-bit datastream, which has a fill-scale swing. This bit stream has just two-level information, "1"s and "0"s. The duty ratio chosen for these two levels generally is 50%/50%, and in that case, the averaged analog signal (i.e., low-pass-filtered analog signal) of full-scale cannot exceed 50% of the power supply voltage of the averaging circuitry. However, according to the definition of SACD, the full-scale of the digitized signal (i.e., the DSD signal, which is analog-to-digital converted by the oversampling modulator) is allowed to be 70% of the full-scale amplitude of a source analog signal at its maximum.

As a result, if a sequence of PDM digital signals is averaged as it is by an analog low pass filter or the like as mentioned above, a full-scale amplitude of an analog output is also reduced to 50%, resulting in a lower S/N ratio for noise in an analog circuit region of the analog low pass filter. On the other hand, a digital signal recorded in accordance with the conventional PCM scheme ensures a full-scale amplitude of 100%, so that the digital signal can be output with an amplitude approximately 100% of the amplitude of the source analog signal for an effective maximum amplitude of an output analog circuit in a digital-to-analog converter.

Thus, when an analog output circuit having equivalent noise components is used, the DSD scheme is disadvantageous over the PCM scheme and the SACD scheme because of the relatively lower S/N ratio associated with the DSD scheme.

Also, when a digital-to-analog (DA) converter is designed such that a DSD signal reproducing unit and a PCM signal reproducing unit share an analog output circuit, the two signals present unmatched full-scale amplitude levels and accordingly largely different S/N ratios.

SACD discs have a double layer of data storage, wherein a conventional PCM signal is stored in one layer as for conventional CD playback mode and the DSD signal is stored in the other layer as for SACD playback mode. It would be desirable to have a CD/SACD player which can inexpensively utilize a single playback circuit to accomplish the playback of music in either the CD mode or the SACD mode from the same SACD disc, and it would be desirable for the CD/SACD player to have a similar level of S/N ratio for output signal produced in both the CD mode and the SACD mode. One technique tries to cause the signal-to-noise ratio (SNR) of the SACD analog output (ie., playback signal) to appear to be higher than the SNR for conventional CD playback by intentionally degrading the CD SNR and enhancing the SACD SNR, in order to show that the SACD scheme is better than the conventional CD scheme. But, it would be desirable to provide a genuinely improved technique for increasing the SACD SNR.

As described above, in the DSD scheme using a conventional analog low pass filter to reproduce an analog signal, the DSD scheme is disadvantageous over the PCM scheme and SACD scheme in view of the S/N ratio.

SUMMARY OF THE INVENTION

It is therefore an object of the present invention to provide a method and apparatus for improving the S/N ratio characteristic in digital-to-analog conversion of a digital signal which has a reduced full-scale signal (as compared to the full scale value of a source analog signal), such as a pulse density modulated digital signal recorded in accordance with the DSD scheme.

It is another object of the invention to provide improved performance of a DSD digital-to-analog conversion system that is equivalent to the performance of a conventional CD system.

It is another object of the invention to provide a digital-to-analog conversion system that decodes information in either DSD format or CD (PCM) format so as to produce an equivalent analog output signal.

To achieve the above objects, the present invention provides a method of inproving an S/N ratio in digital-to-analog conversion of a pulse density modulated (PDM) digital signal represented by a waveform having a first predetermined full scale, where the PDM digital signal includes a signal component having a second predetermined fill scale, and the digital-to-analog conversion has a third predetermined full scale. The method comprises the steps of extracting the signal component from the PDM digital signal to generate an extracted signal having the second full scale; and matching the second full scale of the extracted signal with the third full scale of the digital-to-analog conversion.

According to the present invention, the step of extracting the signal component may include digital low pass filtering or decimation filtering.

Also, according to the present invention, the step of matching the full scale may include digitally multiplying the extracted signal.

The present invention also provides an apparatus for improving an S/N ratio in digital-to-analog conversion of a pulse density modulated (PDM) digital signal represented by a waveform having a first predetermined full scale, where the PDM digital signal includes a signal component having a second predetermined full scale, and the digital-to-analog conversion has a third predetermined full scale. The apparatus comprises digital filtering means for digitally filtering the PDM signal to extract the signal component, and generating a digitally filtered output signal in a digital form, where the digital filtering means has the second full scale; and full scale matching means for matching the second full scale of the digitally filtered output signal with the third full scale of the processing.

According to the latter embodiment of the present invention, the digital filtering means may include a digital low pass filter or decimation filter.

Also, according to the latter embodiment of the present invention, the full-scale matching means may include multiplying means for digitally multiplying the filtered output signal to generate a digitally multiplied output signal in a digital form.

BRIEF DESCRIPTION OF THE DRAWING

FIG. 7 is a block diagram illustrating use of the DSD (direct-stream digital: super audio CD) system of FIG. 5 together with a conventional CD system sharing a single digital-to-analog converter.

FIG. 8 is a block diagram illustrating use of the DSD (direct-stream digital: super audio CD) system of FIG. 6 together with a conventional CD system sharing a single digital-to-analog converter.

FIG. 9 is a block diagram of the digital-to-analog converter 20 of FIGS. 7 and 8.

DETAILED DESCRIPTION OF THE INVENTION

The present invention will hereinafter be described in connection with several embodiments thereof with reference to the accompanying drawings.

Figure 1:
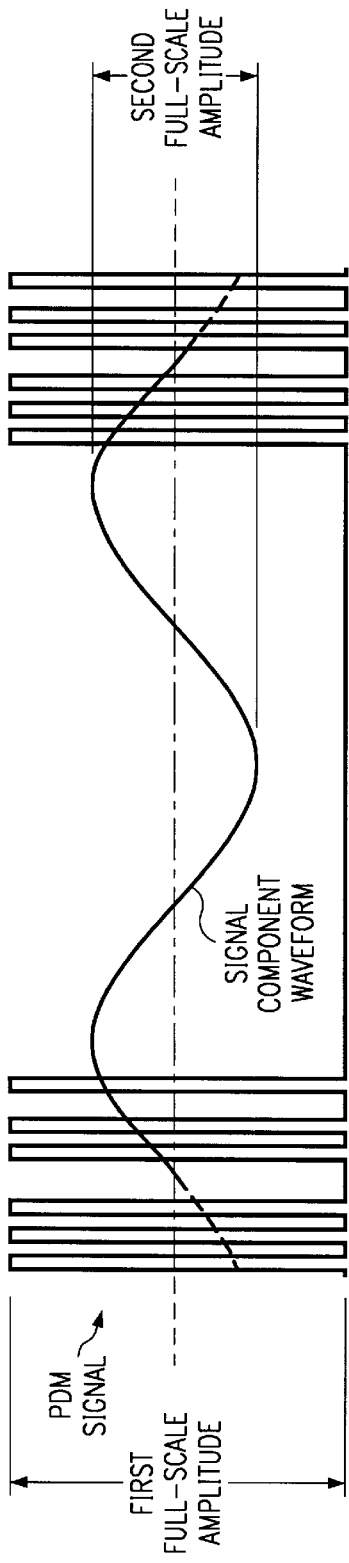
FIG. 1 shows in detail a pulse density modulated (PDM) signal.

Referring first to FIG. 1, a PDM modulated signal will be described. The PDM modulated signal represents a source signal as the density of a pulse train. Specifically, when such a PDM signal is output as it is in the form of voltage, the PDM signal is represented by a waveform which goes up and down between a ground level and a power supply voltage, as shown in FIG. 1. The amplitude of this waveform is referred to as a first full-scale amplitude. The source signal is included in this signal, wherein the pulse train has various portions of relative sparseness of pulses and portions of relative denseness of pulses with respect to a certain reference frequency (for example, 64Fs (where Fs=44.1 kHz), so that the full-scale amplitude of the source signal within the PDM signal (second full-scale amplitude) is naturally smaller than the first full-scale amplitude which represents the power supply voltage.

Further, from a general nature of a delta-sigma type A/D converter (not shown) for converting the source signal to a PDM signal, the second full-scale amplitude is smaller than the first full scale amplitude, and is as small as one half of the full-scale amplitude of the source analog input signal.

Figure 2:
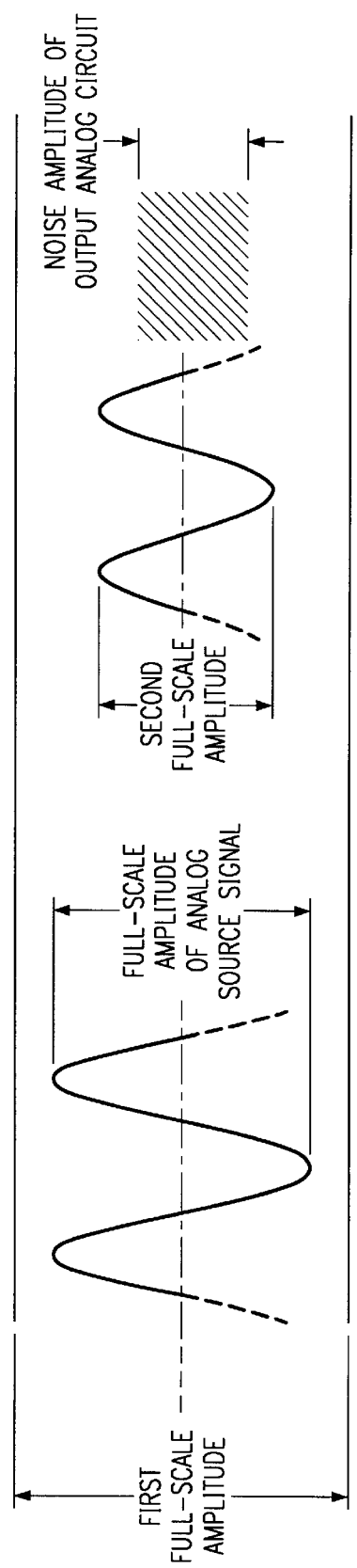
FIG. 2 shows a relationship among a full scale of an analog source signal input, a full scale of a PDM signal or a first full scale, a full scale of a source signal component included in the PDM signal or a second full scale amplitude, and a noise amplitude of an output analog circuit such as a digital-to-analog (A/D) converter, on the assumption that a power supply voltage of a delta-sigma type A/D converter is the same as the power supply voltage of the output analog circuit such as the A/D converter.

FIG. 2 shows a relationship between a full scale of an analog source signal input, a full scale of a PDM signal or a first full scale, a full scale of a source signal component included in the PDM signal or a second full-scale amplitude, and a noise amplitude of an output analog circuit such as a digital-to-analog (A/D) converter, on the assumption that a power supply voltage of a delta-sigma type A/D converter is the same as the power supply voltage of the output analog circuit such as the AID converter.

Figure 3:
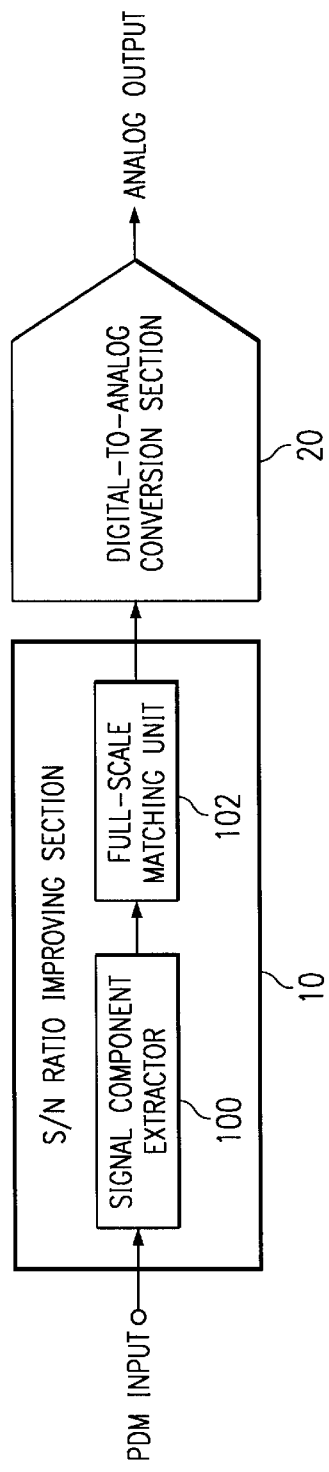
FIG. 3 is a block diagram illustrating a digital-to-analog conversion system which implements an S/N ratio improving method according to the present invention.

Referring to FIG. 3, a digital-to-analog conversion system based on the basic concept of the present invention comprises a S/N ratio improving section 10 which receives a PDM input, and a digital-to-analog (A/D) conversion section 20 which receives the output of the S/N ratio improving section 10. The S/N ratio improving section 10 includes a signal component extractor 100 and a full-scale matching unit 102. The signal component extractor 100 extracts a digital signal component corresponding to a source signal from a PDM digital signal input, and the full-scale matching unit 102, which receives the extracted digital signal component increases the full-scale amplitude of the extracted digital signal component to a desired full-scale amplitude. Subsequently, the digital-to-analog conversion section 20 receives the resulting output from the full-scale matching unit 102, and digital-to-analog converts the digital signal to generate an analog output. The full-scale amplitude of the extracted digital component must be "gained up" i.e., amplified, to improve the SNR of the analog output signal such that the full-scale amplitude of the gained up signal has the desired level compared to the total equivalent input noise of various analog components in the digital-to-analog converters.

Figure 4:
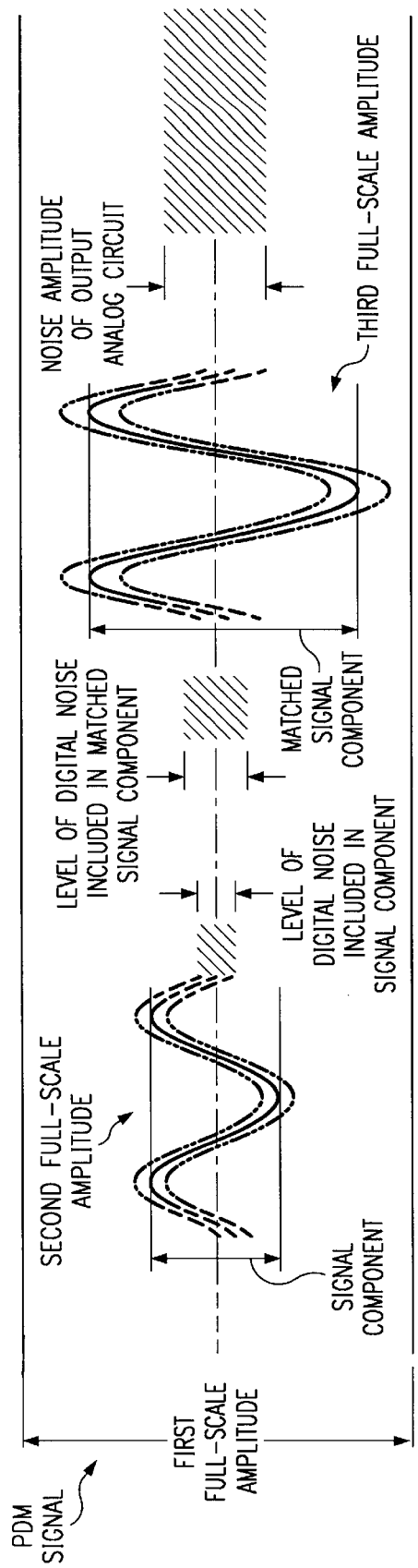
FIG. 4 schematically shows a relationship between a change in a full-scale signal amplitude and a noise level in the system of FIG. 3.

FIG. 4 schematically represents a relationship between a signal amplitude and a noise level in the foregoing process. Generally, a digital base noise (floor noise) within a desired frequency region included in a PDM digital signal is by nature very much lower than a noise level of an analog output circuit (in this embodiment, the digital-to-analog converter). Thus, although the digital base noise is also increased together with the source signal in the full-scale matching unit 102 (for example, an increase of the source signal level by a factor of 2.0 results in an increase of the digital base noise by a factor of 2.0 as well), the digital base noise is still lower than the noise level of the analog output circuit, and accordingly, the S/N ratio of the output signal produced by digital-to-analog conversion circuit 20 in an implementation of the intervention by the assignee is improved by 6 dB.

In a specific implementation of the present invention, the foregoing system may be configured of a digital filter capable of gain scaling, and a digital-to-analog (A/D) converter. In this configuration, the function of the digital filter is very important. The digital filter for achieving the present invention is characterized in that when a PDM signal input thereto is oversampled 64 times in a 1-bit organization, a filtered digital signal remains, for example, oversampled 64 times in a 24-bit organization (as in subsequently described FIG. 5), or is decimated to eight times when decimation is used (as in subsequently described FIG. 6). Stated another way, assuming that an input PDM signal is comprised of M bits at P×Fs, an output digital signal of the filter is comprised of N bits at Q×Fs, where $N \geq M$ and $Q \leq P$. Also, within this digital filter, the full-scale amplitude of the digital source signal component is amplified.

The amplification factor can be chosen according to a predetermined number which is defined from the DSD signal source and the target SNR of the total system. For example, the amplification factor is 2 if the DSD signal was obtained by a delta sigma analog-to-digital-converter having a gain of 50 percent. Another way for setting the amplification factor is by adding a peak detection function after the digital filter, in which case the full-scale signal of in-band frequency is supplied as a PDM one-bit scheme for the reference, and the amplification factor is defined by knowing the peak level of the filtered PDM signal. The amplification factor can be dynamically set in order to gain up the signal so as to satisfy a required distortion number (such as the total harmonic distortion (THD)) of the full-scale signal of the analog output, which is also a predetermined target of the total system (including an analog output amplifier).

It is to be understood that there is no specific, limited definition of what is meant by the "third full-scale value" described herein, and that the third full-scale value is chosen and determined according to the particular application in which the described digital-to-analog conversion circuit/method is utilized. The "matching" described herein means providing the gain factor with a value which causes the extracted signal to be amplified or multiplied so as to have a full-scale value that is approximately equal to the third full-scale value of the analog output signal. Thus, the third full-scale value of the analog output is a flexible but predetermined value.

These functions are completely different from those provided by a digital interpolation filter (as in subsequently described FIG. 7) for use in digital-to-analog conversion of a digital signal which is recorded in accordance with the conventional PCM scheme and the SACD scheme. In a digital filter according to the PCM scheme and the SACD scheme, Q>P is satisfied, and the full-scale amplitude remains unchanged. Also, in a digital filter according to the PCM scheme and the SACD scheme, the amplification of the full-scale amplitude (i.e., the volume control) may be implemented by use of a digital multiplier circuit, or by a method of shifting the position of a data bit train to a higher digit.

Figure 5:
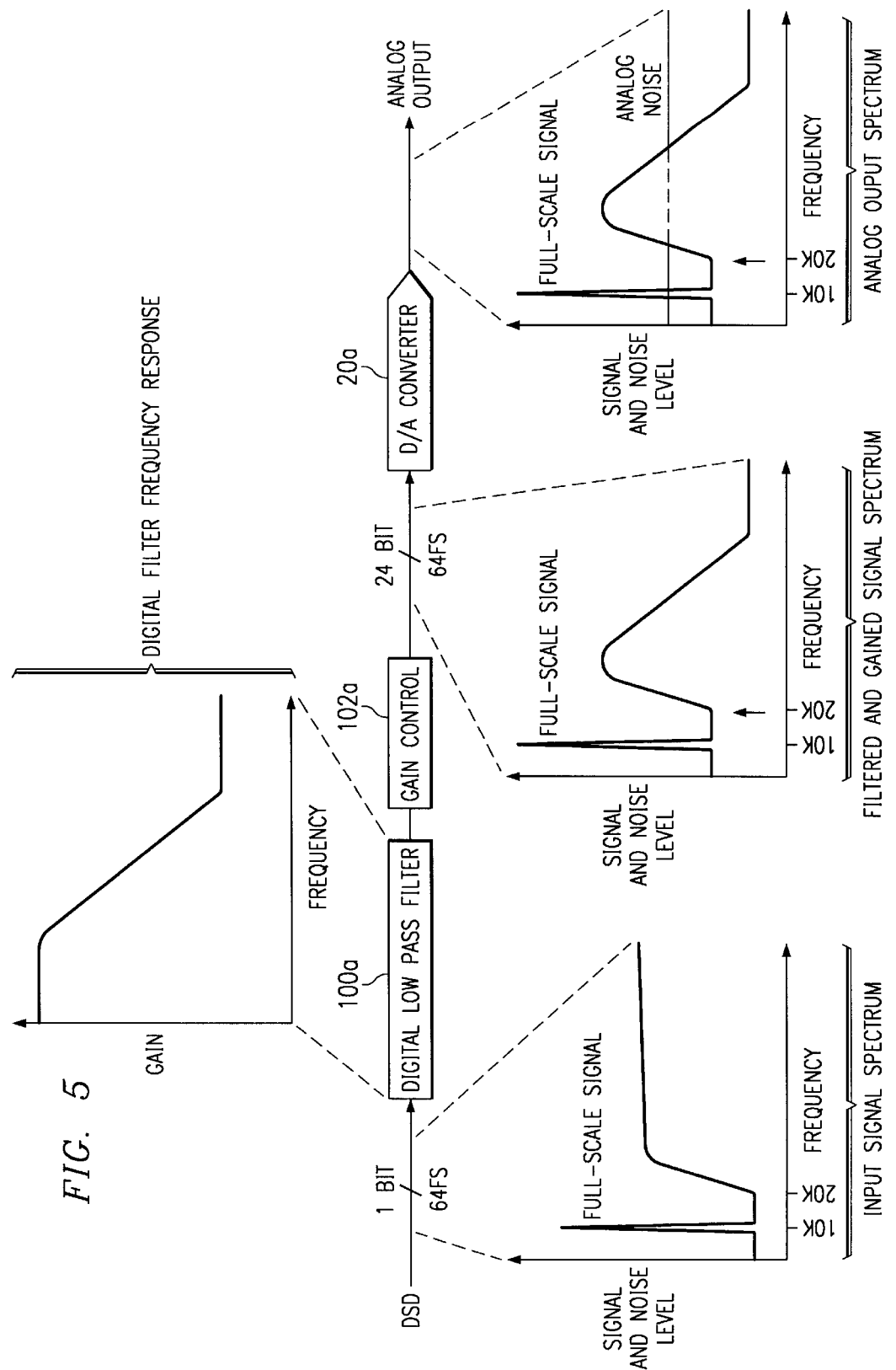
FIG. 5 illustrates an embodiment of a digital-to-analog conversion system according to the present invention which does not use a decimation filter in a digital signal processing step, and also shows the frequency characteristics of an input signal, a filter output, a gain control circuit output, and a D/A converter output.

FIG. 5 illustrates a digital-to-analog conversion system according to one embodiment of the present invention. The system comprises a digital low pass filter 100a, a gain control circuit 102a, and a multibit digital-to-analog (D/A) converter 20a. An input signal is a 1-bit signal at 64 Fs (Fs=44.1 kHz) which is oversampled 64 times an analog-to-digital converted by a delta-sigma modulator. The digital low pass filter 100a outputs 24-bit data of weighted binary code at 64 Fs, as it is, in the form of parallel data. The gain control preferably is accomplished by a digital multiplier. The 24-bit parallel data is fed to parallel input terminals of the multibit D/A converter 20a corresponding to the respective bit weights.

The graphs in FIG. 5 also conceptually show a process in which the gain control circuit 102a increases the full-scale amplitude of input data, and rejects out-of-band digital noise in the system of FIG. 5. The graphs in FIGS. 5 and 6 clearly indicate the filtering and gaining functions. The full-scale signal is indicated, and its magnitude is increased after the gain control function is performed. Specifically, FIG. 5 shows the input signal spectrum characteristics of an input signal, the gain vs. frequency characteristic of the digital low pass filter 100a, the frequency spectrum of the gain control circuit 102a, and the frequency spectrum of the output of the D/A converter 20a, respectively (a signal component at 10 KHz is also included as an example). The "ANALOG NOISE" level indicated in the graph shows the noise level of the analog output circuit in the digital-to-analog converter. It should be noted that the vertical axis is represented in logarithmic scale. Since this system must digital-to-analog convert a digital data sequence at a frequency as high as 64 Fs (Fs=44.1 kHz), a relatively fast multibit D/A converter is required.

Figure 6:
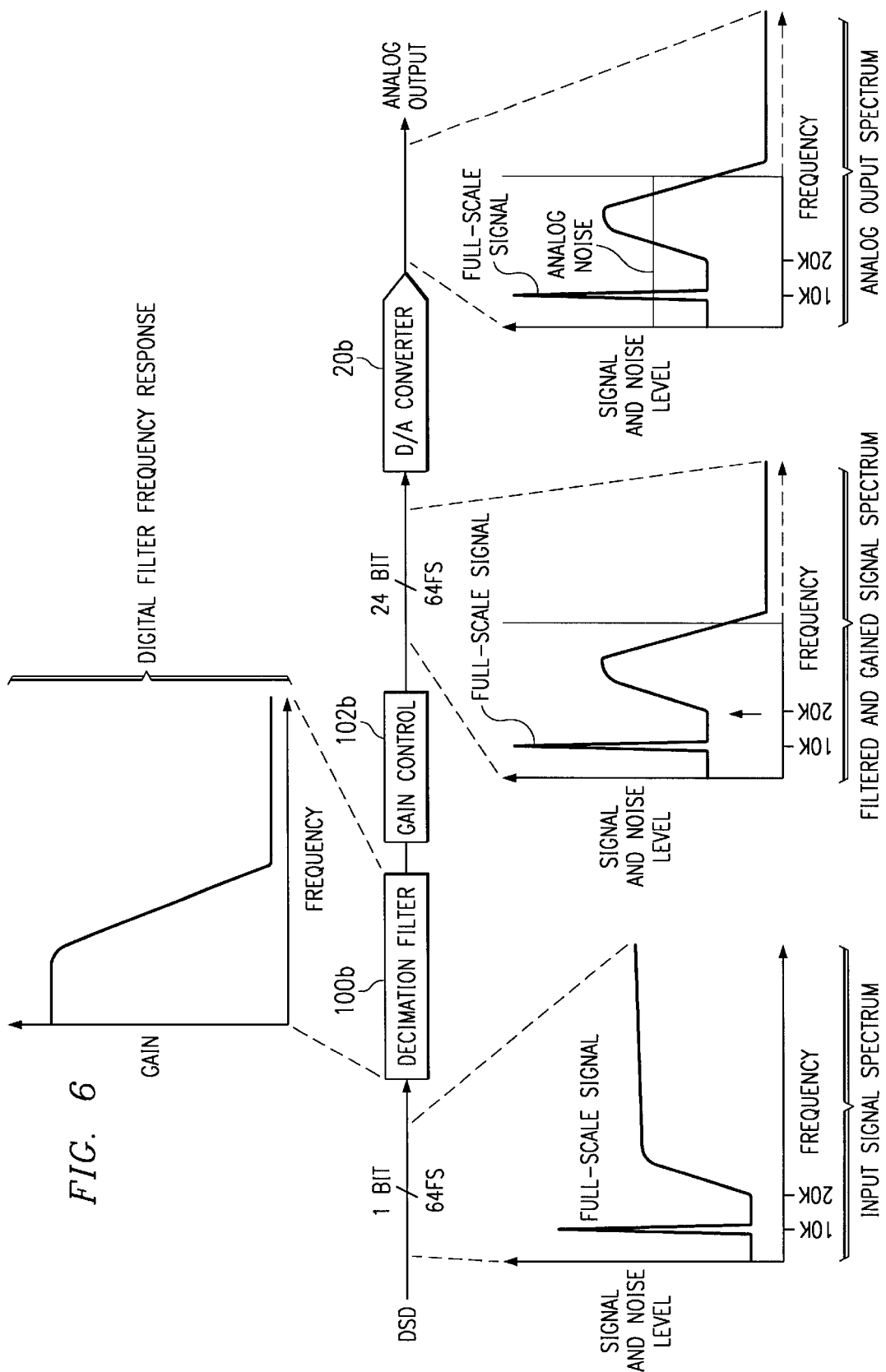
FIG. 6 illustrates another embodiment of the digital-to-analog conversion system according to the present invention which uses a decimation filter in the digital signal processing step, and also shows the frequency characteristics of an input signal, a filter output, a gain control circuit output, an D/A converter output.

FIG. 6 illustrates another embodiment of the digital-to-analog conversion system which employs a decimation filter in a digital signal processing step. The system comprises a decimation filter 100b, a gain control circuit 102b, and a multibit D/A converter 20b. The graphs shown in FIG. 6 correspond to those shown in FIG. 5.

As compared with the embodiment of FIG. 5, the system of FIG. 6 decimates data three times (i.e., increases the number of bits in the data word and divides the data rate by 2 three consecutive times) in the decimation filter 100b after the data has been low-pass-filtered. As a result, the input data is converted to 20-bit binary data at 8 Fs. Thus, the clock rate of the digital data train is reduced by a factor of 8, so that the conversion rate of the multibit D/A converter 20b can be reduced. Likewise, in this configuration, the gain control circuit 102b increases the full-scale amplitude of the extracted digital signal, and, in cooperation with decimation filter 100b, rejects out-of-band digital noise. However, the decimation of data causes aliasing of noise into the signal band, so the noise level within the band is increased as compared with the embodiment of FIG. 5, which does not perform decimation.

The foregoing embodiments should be selected for use in a particular application based on required specifications, i.e., total determination on the filter characteristics, a circuit scale (i.e., circuit size), the characteristic of the digital-to-analog converter, and so on. Anyway, the method and apparatus according to the present invention can bring out high analog performance which cannot be accomplished by any conventional scheme.

As described above, in comparison with the conventional DSD signal digital-to-analog conversion scheme which has been disadvantageous over the PCM scheme and the SACD scheme with respect to S/N ratio because of the full-scale amplitude of an analog reproduced signal being a smaller than an effective amplitude level of an analog output circuit, the present invention filters a PDM digital input signal in a digital domain to extract a source signal, amplifies the full-scale amplitude of the extracted source signal, and then digital-to-analog converts the amplified source signal to fully extend the output to an effective amplitude level of an analog output circuit, thereby making it possible to achieve a high S/N ratio to noise involved in the analog output circuit.

FIGS. 7 and 9 show how a CD system and a DSD system can be configured to provide their respective outputs as inputs to a single shared audio amplifier. Referring to FIG. 7, the system 1A is shown wherein either/both information encoded by an SACD encoder 12 and written into a recording medium 13A such as a CD disc, and information encoded by a DSD encoder 22 and written into a recording medium 13B, can be decoded and amplified by a decoding system including an CD decoder 14 and a DSD decoder 24A. The system 1A also includes a digital switch circuit 25 which selectively couples a 24 bit output 18A from CD decoder 14 or the 24 bit output 18B of DSD decoder 24A to the input of a digital-to converter 20. The output 28 of digital-to-analog converter 20 drives a speaker 31, as shown in FIG. 9. The PCM signal stored on a CD generally is a 16 bit signal. In the embodiments of FIGS. 7 and 8, the 16-bit PCM signal is converted to a 24-bit PCM signal by some data processing (not shown) before being applied to the input of the interpolation filter 15.

CD decoder 14 thus receives a 1Fs 24-bit PCM signal as its digital input from CD disc 13A, and produces an analog output signal 18A which is applied to one input of digital switch circuit 25 of FIG. 9. CD decoder 14 includes an 8× digital interpolation filter 15 which digitally filters the digital input received from CD disc 13A to produce an 8Fs 24 bit digital signal on the bus 19 and applies it to the input of an interpolator 33. Interpolator 33 produces a 64Fs 24 bit digital signal on bus 18A to one input of digital switch 25, which provides the selected signal 18A or 18B to the input of digital-to-analog converter 20.

As shown in FIG. 9, digital-to-analog converter 20 includes a delta sigma modulator 44 having its 24-bit input connected to the output of switch circuit 25. The output of delta sigma modulator 44 is connected to the input of digital-to-analog conversion element circuitry 46, the to output of which is filtered by an analog low pass filter 48. The number of bits of the output of delta sigma modulator 44 is selected depending on the topology of the delta sigma modulator, which is designed according to the in-band and out-of-band signal spectrum requirements. The output of analog low pass filter 48 is connected to the input of an amplifier 50, which produces the analog output signal 28 connected to drive the speaker 31. Digital-to-analog conversion element circuit 46 can be selected on the basis of the integrated circuit manufacturing process technology utilized and on the basis of various other factors of hardware implementation. Note that a variety of known digital-to-analog conversion element/techniques can be utilized to accomplish the function of block 46.

DSD decoder 24A is essentially the system disclosed in above described FIG. 3, and can be implemented either as shown in above described FIG. 5 or above described FIG. 6. DSD decoder 24A includes digital filter 100a which filters the 64Fs one-bit DSD signal and applies result to digital gain control circuit 102a to produce a 64Fs 24 bit digital signal on the bus 18B, which is applied to the other input of digital switch circuit 25.

By integrating the system as shown in FIGS. 7 and 9, the amplitudes of two kinds of processed audio digital signals can be matched in the digital domain. Accordingly, the expensive analog components can be shared for each digital signal code playback without any manual control of attenuation in the analog domain. As a result, degradation of the DSD signal S/N ratio at the analog output 28 can be eliminated.

The system shown in FIG. 8 is similar to that of FIG. 7, except that in FIG. 8 the CD decoder includes only the 8× interpolation digital filter 15 and produces the output on bus 18A as an 8Fs 24 bit digital signal, and DSD decoder 24B includes a decimation filter 100b having its output connected to the input of the gain control circuit 102b to produce a 8Fs 24 bit digital signal on bus 18B. The major difference between the systems of FIGS. 7 and 8 is the oversampling rate of the digital signal prior to digital-to-analog converter 20, which is chosen based on the switching speed limitations of the selected digital-to-analog conversion element circuit 46.

Thus, the present invention improves the SNR in digital-to-analog conversion of a digital signal which has a reduced full-scale amplitude compared to the full-scale amplitude of a source analog signal represented by a digital, such as a PDM digital signal recorded in accordance with the DSD scheme. The invention provides improved performance of a DSD digital-to-analog conversion system that is equivalent to the performance of a conventional CD system. The present invention also provides a digital-to-analog conversion system that decodes information in either DSD format or PCM format so as to produce a substantially equivalent analog output signal in either case.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed is:

1. A method of improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said method comprising the steps of:

extracting said signal component from said PDM digital signal to generate an extracted digital signal having said second full scale value;

matching said second full scale value of said extracted signal with said third full scale value of said analog output signal; and performing a digital-to-analog conversion of said extracted signal having said matched second full scale value to produce said analog output signal having said third predetermined full scale value.

2. A method of improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said method comprising the steps of:

extracting said signal component from said PDM digital signal to generate an extracted digital signal having said second fill scale value, increasing the amplitude of said extracted signal according to an amplification factor so as to match said second full scale value of said extracted signal with said third full scale value of said analog output signal; and performing a digital-to-analog conversion of said extracted signal having said matched second full scale value to produce said analog output signal having said third predetermined full scale value.

3. The method of claim 2 wherein the first predetermined full scale value is determined by a reference voltage.

4. A method of improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said method comprising the steps of:

extracting said signal component from said PDM digital signal to generate an extracted digital signal having said second full scale value by digital-low-pass filtering said PDM digital signal;

matching said second full scale value of said extracted signal with said third full scale value of said analog output signal; and performing a digital-to-analog conversion of said extracted signal having said matched second full scale value to produce said analog output signal having said third predetermined full scale value.

5. A method of improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said method comprising the steps of:

extracting said signal component from said PDM digital signal to generate an extracted digital signal having said second full scale value by decimation filtering said PDM digital signal;

matching said second full scale value of said extracted signal with said third full scale value of said analog output signal; and performing a digital-to-analog conversion of said extracted signal having said matched second full scale value to produce said analog output signal having said third predetermined full scale value.

6. A method of improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said method comprising the steps of:

extracting said signal component from said PDM digital signal to generate an extracted digital signal having said second full scale value;

increasing the amplitude of said extracted signal according to an amplification factor so as to match said second full scale value of said extracted signal with said third full scale value of said analog output signal by digitally multiplying said extracted signal by an amplification factor having a value which causes the analog output signal to have less than a predetermined distortion number; and performing a digital-to-analog conversion of said extracted signal having said matched second full scale value to produce said analog output signal having said third predetermined full scale value.

7. A method of improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said method comprising the steps of:

extracting said signal component from said PDM digital signal to generate an extracted digital signal having said second full scale value;

increasing the amplitude of said extracted signal according to an amplification factor so as to match said second full scale value of said extracted signal with said third full scale value of said analog output signal by digitally multiplying said extracted signal by an amplification factor having a value which causes the analog output signal to have at least a predetermined signal-to-noise ratio; and performing a digital-to-analog conversion of said extracted signal having said matched second full scale value to produce said analog output signal having said third predetermined full scale value.

8. A method of digital-to-analog conversion of a signal from either a CD disc or a SACD disc, comprising:

(a) producing a PDM signal which is either
   i. a 1Fs 24 bit PCM signal from digital information stored in a CD disc, or
   ii. a 64Fs 1 bit DSD signal from digital information stored in a SACD disc, wherein Fs is a frequency of sampling of the PDM signal;

(b) if the PDM signal is the 1Fs 24 bit PCM signal, filtering the 1Fs 24 bit PCM signal by means of an 8× interpolation digital filter to produce an 8Fs 24 bit signal and interpolating the 8Fs 24 bit signal to produce a first 64Fs 24 bit signal 18A,
   and if the PDM signal is the 64Fs 1 bit DSD signal, filtering the 64Fs 1 bit DSD signal by means of a digital filter and digitally multiplying an output produced by the digital filter by an amplification factor to produce a second 64Fs 24 bit signal;

(c) selecting the produced 64Fs 24 bit signal for the 64Fs 24 bit signal by means of a switch circuit; and (d) converting the selected one of the first and second 64Fs 24 bit signals to an analog signal by means of a digital-to-analog converter, the amplification factor having a value that causes a signal-to-noise ratio of the second 64Fs 24 bit signal to be approximately equal to a signal-to-noise ratio of the first 64Fs 24 bit signal.

9. The method of claim 8 wherein the converting of step (d) includes delta-sigma modulating the selected one of the first and second 64Fs 24 bit signals, performing a digital-to-analog conversion of a signal resulting from the delta-sigma modulating by means of digital-to-analog conversion elements, and low pass filtering a signal resulting from the analog conversion of the signal resulting from the delta-sigma modulating.

10. A method of digital-to-analog conversion of a signal from either a CD disc or a SACD disc, comprising:
   (a) producing a PDM signal which is either
      i. a P1×Fs M-bit PCM signal from digital information stored in a CD disc, wherein P1 is a first oversampling ratio and M is an integer, or
      ii. a P2×Fs 1 bit DSD signal from digital information stored in a SACD disc, wherein P2 is a second oversampling ratio which is greater P1, and wherein Fs is a frequency of sampling of the PDM signal;
   (b) if the PDM signal is the P1×Fs M-bit PCM signal, filtering the P1×Fs M-bit PCM signal by means of an interpolation digital filter to produce a P3×Fs M-bit signal and interpolating the P3×Fs M-bit signal to produce a first P1×Fs M-bit signal, wherein P3 is a third oversampling ratio,
   and if the PDM signal is the P2×Fs 1 bit DSD signal, filtering the P2×Fs 1 bit DSD signal by means of a digital filter and digitally multiplying an output produced by the digital filter by an amplification factor to produce a second P2×Fs M-bit signal;
   (c) selecting the produced P2×Fs M-bit signal for the P2×Fs M-bit signal by means of a switch circuit; and
   (d) converting the selected one of the first and second P2×Fs M-bit signals to an analog signal by means of a digital-to-analog converter,
   the amplification factor having a value that causes a signal-to-noise ratio of the second P2×Fs M-bit signal to be approximately equal to a signal-to-noise ratio of the first P1×Fs M-bit signal.

11. The method of claim 10 wherein the converting of step (d) includes delta-sigma modulating the selected one of the first and second P2×Fs M-bit signals, performing a digital-to-analog conversion of a signal resulting from the delta-sigma modulating by means of digital-to-analog conversion elements, and low pass filtering a signal resulting from the analog conversion of the signal resulting from the delta-sigma modulating.

12. The method of claim 11 including amplifying the low pass filtered signal to provide a drive signal to a speaker.

13. A method of digital-to-analog conversion of a signal from either a CD disc or a SACD disc, comprising:
   (a) producing a PDM signal which is either
      i. a 1Fs 24 bit PCM signal from digital information stored in a CD disc, or
      ii. a 64Fs 1 bit DSD signal from digital information stored in a SACD disc, wherein Fs is a frequency of sampling of the PDM signal;
   (b) if the PDM signal is the 1Fs 24 bit PCM signal, filtering the 1Fs 24 bit PCM signal by means of an 8× interpolation digital filter to produce an 8Fs 24 bit signal,
   and if the PDM signal is the 64Fs 1 bit DSD signal, filtering the 64Fs 1 bit DSD signal by means of a decimation filter and digitally multiplying an output produced by the decimation filter by an amplification factor to produce a second 8Fs 24 bit signal;
   (c) selecting the produced 8Fs 24 bit signal for the 8Fs 24 bit signal by means of a switch circuit; and
   (d) converting the selected one of the first and second 8Fs 24 bit signals to an analog signal by means of a digital-to-analog converter,
   the amplification factor having a value that causes a signal-to-noise ratio of the second 8Fs 24 bit signal to be approximately equal to a signal-to-noise ratio of the first 8Fs 24 bit signal.

14. The method of claim 13 wherein the converting of step (d) includes delta-sigma modulating the selected one of the first and second 8Fs 24 bit signals, performing a digital-to-analog conversion of a signal resulting from the delta-sigma modulating by means of digital-to-analog conversion elements, and low pass filtering a signal resulting from the analog conversion of the signal resulting from the delta-sigma modulating.

15. The method of claim 14 including amplifying the low pass filtered signal to provide a drive signal to a speaker.

16. A method of digital-to-analog conversion of a signal from either a CD disc or a SACD disc, comprising:
   (a) producing a PDM signal which is either
      i. a P1×Fs M-bit PCM signal from digital information stored in a CD disc, wherein P1 is a first oversampling ratio and M is an integer, or
      ii. a P2×Fs 1 bit DSD signal from digital information stored in a SACD disc, wherein P2 is a second oversampling ratio which is greater than P1, and wherein Fs is a frequency of sampling of the PDM signal;
   (b) if the PDM signal is the P1×Fs M-bit PCM signal, filtering the P1×Fs M-bit PCM signal by means of an interpolation digital filter to produce an P3×Fs M-bit signal, wherein P3 is a third oversampling ratio,
   and if the PDM signal is the P2×Fs 1 bit DSD signal, filtering the P2×Fs 1 bit DSD signal by means of a decimation filter and digitally multiplying an output produced by the decimation filter by an amplification factor to produce a second P3×Fs M-bit signal;
   (c) selecting the produced P3×Fs M-bit signal for the P3×Fs M-bit signal by means of a switch circuit; and
   (d) converting the selected one of the first and second P3×Fs M-bit signals to an analog signal by means of a digital-to-analog converter,
   the amplification factor having a value that causes a signal-to-noise ratio of the second P3×Fs M-bit signal to be approximately equal to a signal-to-noise ratio of the first P3×Fs M-bit signal.

17. The method of claim 16 wherein the converting of step (d) includes delta-sigma modulating the selected one of the first and second P3×Fs M-bit signals, performing a digital-to-analog conversion of a signal resulting from the delta-sigma modulating by means of digital-to-analog conversion elements, and low pass filtering a signal resulting from the analog conversion of the signal resulting from the delta-sigma modulating.

18. The method of claim 17 including amplifying the low pass filtered signal to provide a drive signal to a speaker.

19. An apparatus for improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said apparatus comprising:
   a digital filtering circuit for digitally filtering said PDM signal to extract said signal component, and generating a digitally filtered output signal in a digital form, said digitally filtered output signal having said second full scale value;

a full scale matching circuit for matching said second full scale value of said digitally filtered output signal with said third full scale value of said processing; and a digital-to-analog conversion circuit for performing a digital-to-analog conversion of said extracted signal having said matched second full scale value to produce said analog output signal having said third predetermined full scale value.

20. An apparatus for improving an S/N ratio according to claim 19 wherein said digital filtering circuit includes a digital low pass filter.

21. An apparatus for improving an S/N ratio according to claim 19, wherein said digital filtering circuit includes a decimation filter.

22. An apparatus for improving an S/N ratio according to claim 19, wherein said full-scale matching circuit includes a multiplying circuit for digitally multiplying said filtered output signal to generate a digitally multiplied output signal in a digital form.

23. An apparatus for improving an S/N ratio in digital-to-analog conversion of a pulse density modulated (PDM) digital signal represented by a waveform having a first predetermined full scale value, said PDM digital signal including a signal component having a second predetermined full scale value, said digital-to-analog conversion producing an analog output signal having a third predetermined full scale value, said apparatus comprising:

a digital low pass filter for digitally filtering said PDM signal to extract said signal component, and generating a digitally filtered output signal in a digital form, said digitally filtered output signal having said second full scale value;

gain control circuitry for increasing the amplitude of said extracted signal according to an amplification factor so as to match said second full scale of said digitally filtered output signal with said third full scale of said processing; and a digital-to-analog converter for performing a digital-to-analog conversion of said extracted signal having said matched second full scale value to produce said analog output signal having said third predetermined full scale value.

* * * * *